(12) United States Patent
Moriyama et al.

(10) Patent No.: US 11,437,941 B2
(45) Date of Patent: Sep. 6, 2022

(54) MOTOR CONTROL DEVICE

(71) Applicants: Kabushiki Kaisha Toshiba, Tokyo (JP); Toshiba Electronic Devices & Storage Corporation, Tokyo (JP)

(72) Inventors: Katsutoshi Moriyama, Yokohama Kanagawa (JP); Takehiro Hara, Yokohama Kanagawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 79 days.

(21) Appl. No.: 17/016,587

(22) Filed: Sep. 10, 2020

(65) Prior Publication Data

US 2021/0297019 A1    Sep. 23, 2021

(30) Foreign Application Priority Data

Mar. 18, 2020  (JP) .............................. JP2020-047287

(51) Int. Cl.
| | |
|---|---|
| *H02P 6/16* | (2016.01) |
| *H02P 6/17* | (2016.01) |
| *H02P 23/14* | (2006.01) |
| *H03K 5/24* | (2006.01) |
| *H03M 1/12* | (2006.01) |
| *H02K 11/215* | (2016.01) |

(52) U.S. Cl.
CPC .............. *H02P 6/17* (2016.02); *H02K 11/215* (2016.01); *H02P 23/14* (2013.01); *H03K 5/24* (2013.01); *H03M 1/1245* (2013.01)

(58) Field of Classification Search
CPC ......... H02P 6/17; H02P 23/14; H02K 11/215; H03K 5/24; H03M 1/1245
See application file for complete search history.

(56) References Cited

U.S. PATENT DOCUMENTS

| | | | |
|---|---|---|---|
| 10,048,297 B2 * | 8/2018 | Motz | ..................... G01R 31/343 |
| 10,439,525 B2 | 10/2019 | Mizuo et al. | |
| 2017/0343382 A1 * | 11/2017 | Fukumura | ................. H02P 6/16 |

FOREIGN PATENT DOCUMENTS

| | | |
|---|---|---|
| JP | H09-154294 A | 6/1997 |
| JP | 2019-088181 A | 6/2019 |
| WO | 2016/204205 A1 | 12/2016 |
| WO | 2019/167763 A1 | 9/2019 |

* cited by examiner

*Primary Examiner* — Cortez M Cook
(74) *Attorney, Agent, or Firm* — Allen & Overy LLP

(57) ABSTRACT

According to one embodiment, there is provided a motor control device including an acquisition unit, an AD conversion unit, a calculation unit and a drive control unit. The acquisition unit acquires an analog signal indicating a rotational position of a motor. The AD conversion unit AD-converts the analog signal to generate a digital value. The calculation unit estimates a slope of a waveform of the analog signal by using a plurality of the digital values and obtains an intersection timing at which a straight line corresponding to the estimated slope intersects with a threshold. The drive control unit controls driving of the motor according to a rotation cycle obtained from a plurality of the intersection timings.

16 Claims, 4 Drawing Sheets

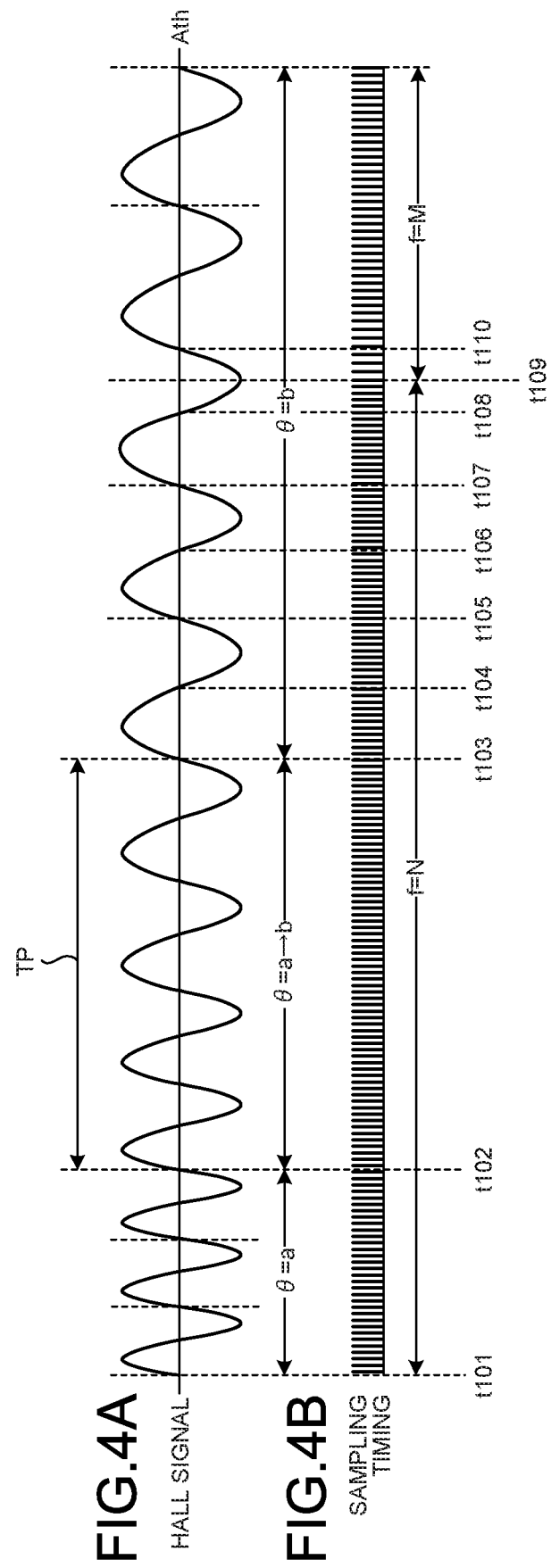

MOTOR CONTROL DEVICE

CROSS-REFERENCE TO RELATED APPLICATIONS

This application is based upon and claims the benefit of priority from Japanese Patent Application No. 2020-047287, filed on Mar. 18, 2020; the entire contents of which are incorporated herein by reference.

FIELD

Embodiments described herein relate generally to a motor control device.

BACKGROUND

A motor control device controls the driving of a motor by supplying driving power to the motor. For example, in order to generate a cycle signal, the motor control device samples a Hall signal at a predetermined sampling timing. A sampling cycle can be predetermined. The Hall signal is an analog signal and is converted into a digital value by being sampled and AD-converted. A high-speed AD converter may be used when the Hall signal is AD-converted, but a sampling frequency becomes high. Therefore, power consumption and heat generation of the motor control device may increase. It is desirable to reduce a sampling error without increasing the power consumption and heat generation of the motor control device.

BRIEF DESCRIPTION OF THE DRAWINGS

FIGS. 4A and 4B are waveform charts illustrating an operation of the motor control device according to the second embodiment.

DETAILED DESCRIPTION

In general, according to one embodiment, there is provided a motor control device including an acquisition unit, an AD conversion unit, a calculation unit and a drive control unit. The acquisition unit acquires an analog signal indicating a rotational position of a motor. The AD conversion unit AD-converts the analog signal to generate a digital value. The calculation unit estimates a slope of a waveform of the analog signal by using a plurality of the digital values and obtains an intersection timing at which a straight line corresponding to the estimated slope intersects with a threshold. The drive control unit controls driving of the motor according to a rotation cycle obtained from a plurality of the intersection timings.

Exemplary embodiments of a motor control device will be explained below in detail with reference to the accompanying drawings. The present invention is not limited to the following embodiments.

First Embodiment

Figure 1:
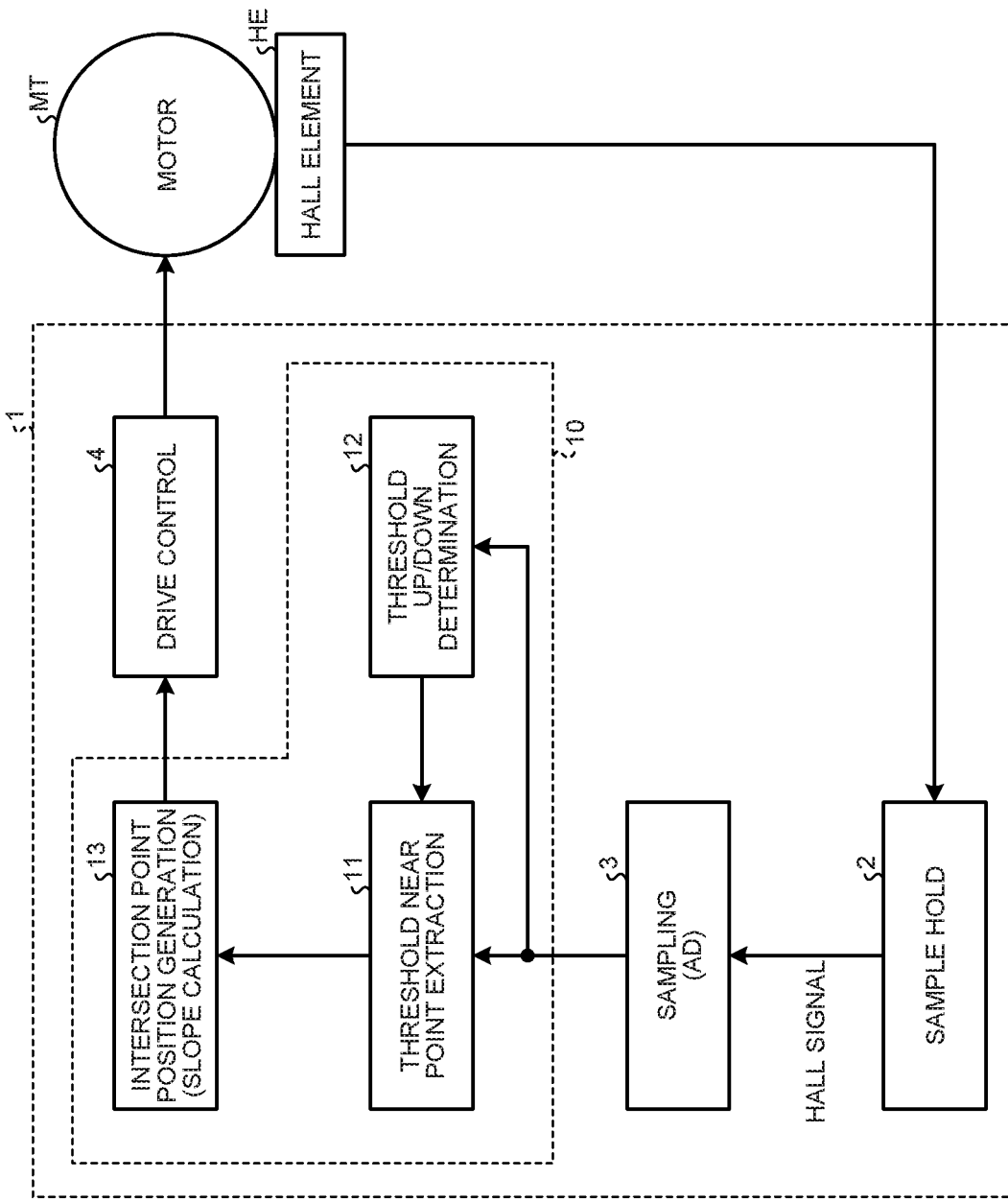
FIG. 1 is a block diagram illustrating a configuration of a motor control device according to a first embodiment.

FIG. 1 is a diagram illustrating a configuration of a motor control device 1 according to a first embodiment. In this embodiment, the motor control device 1 estimates the slope of the Hall signal which is the analog signal waveform crossing the threshold, and obtains the intersection timing at which the straight line indicating the threshold intersects with the straight line corresponding to the estimated slope. The motor control device 1 of this embodiment aims to reduce the sampling error by obtaining the rotation cycle of the motor from the plurality of intersection timings.

Specifically, the motor control device 1 generates a plurality of digital values obtained by AD-converting the Hall signals at a plurality of sampling timings arranged across the threshold, and estimates the slope of the Hall signal crossing the threshold with the plurality of digital values. The Hall signal may be approximately regarded as a straight line in the portion which crosses the threshold. Therefore, the motor control device 1 may obtain the intersection timing at which the straight line indicating the threshold intersects with the straight line corresponding to the estimated slope as a timing at which the Hall signal approximately intersects with the straight line at the threshold. The motor control device 1 may obtain the rotation cycle of the motor from the time intervals of the plurality of intersection timings. Accordingly, the rotation cycle of the motor may be accurately obtained without using a high-speed AD converter. As a result, without increasing the power consumption and heat generation of the motor control device 1, the sampling error may be reduced, and the vibration and noise of a motor MT may be reduced.

The motor control device 1 includes a sample hold unit (acquisition unit) 2, a sampling unit (AD conversion unit) 3, a calculation unit 10, and a drive control unit 4. The motor control device 1 is used for drive control of the motor MT. The motor MT is, for example, a single-phase motor or a three-phase motor. The motor MT has a rotor and a stator, and driving of rotation of the rotor with respect to the stator is controlled.

A Hall element HE is installed in the housing of the motor MT. In a case where the motor MT is a single-phase motor, a single magnetic pole rotates inside the housing of the motor MT. The magnitude of magnetism detected by the Hall element HE is changed periodically by the rotation of the magnetic pole, and a Hall signal changing periodically is output from the Hall element HE. The motor control device 1 AD-converts the Hall signal to generate a cycle signal indicating the rotation cycle of the motor MT, and supplies driving power to the motor MT according to the cycle signal.

For example, in order to generate the cycle signal, the motor control device 1 samples the Hall signal at a predetermined sampling timing. The sampling cycle or sampling frequency may be predetermined. The Hall signal is an analog signal and is converted into a digital value by being sampled and AD-converted. When the cycle signal is generated from the digital value as the sampling result, in a case where the rotation cycle of the motor and the sampling period are deviated, due to the influence of the deviation, the rotation cycle shown by the cycle signal deviates from the actual rotation cycle. When the driving power of the motor is controlled by using the cycle signal including the sampling error which is the error of the rotation cycle, the vibration and noise of the motor may increase.

The motor control device 1 includes a sample hold unit (acquisition unit) 2, a sampling unit (AD conversion unit) 3, a calculation unit 10, and a drive control unit 4. The sample hold unit 2 is arranged between the Hall element HE and the sampling unit 3. The sample hold unit 2 performs a sample hold operation on the Hall signal output from the Hall element HE and holds the Hall signal.

Figure 2:
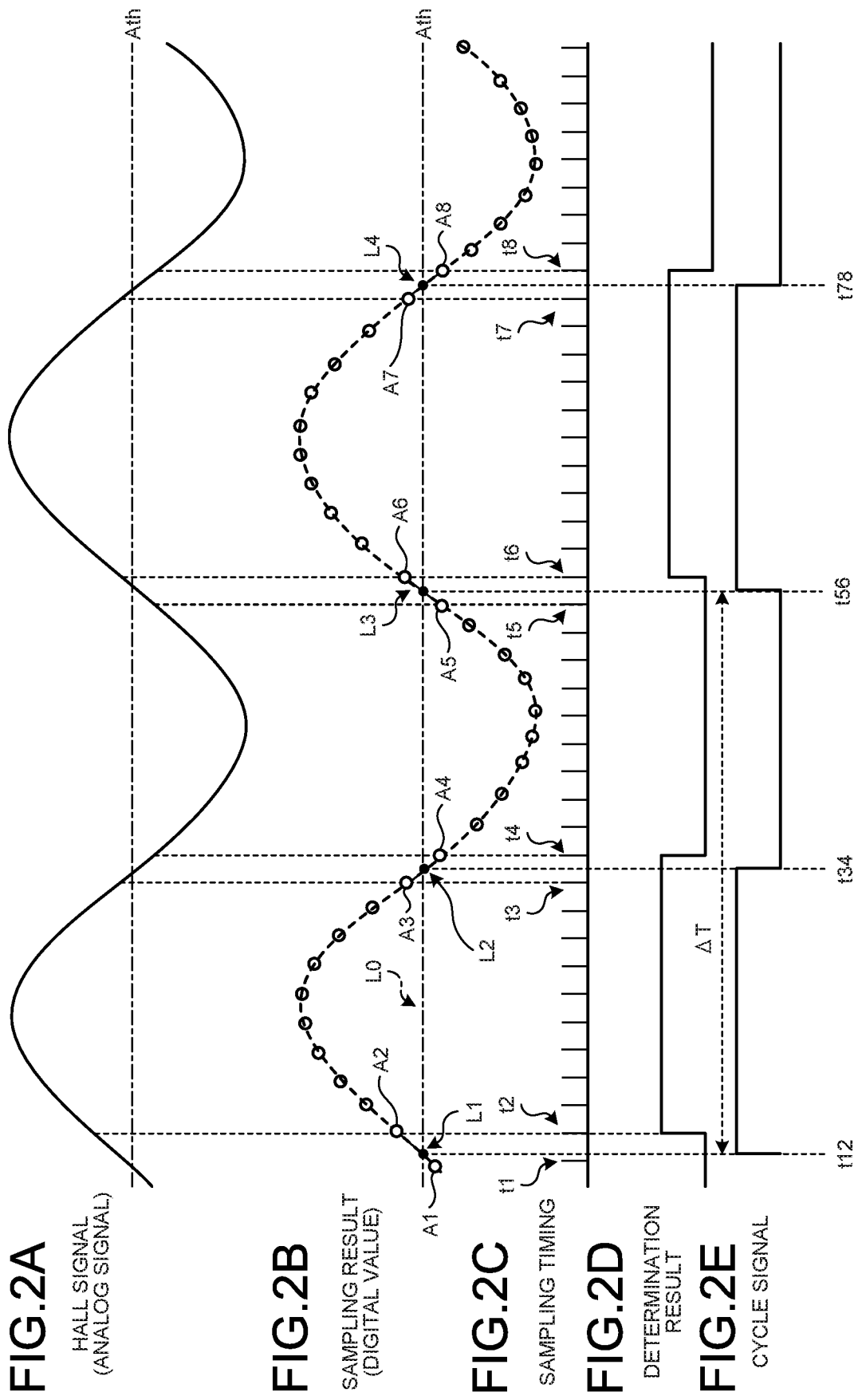
FIGS. 2A to 2E are waveform charts illustrating an operation of the motor control device according to the first embodiment.

FIGS. 2A to 2E are waveform charts illustrating the operation of the motor control device 1. FIG. 2A illustrates the temporal alteration of the Hall signal. The Hall signal is an analog signal which changes according to the rotational position of the magnetic pole in the motor MT within a range of positive amplitude, for example. The Hall signal changes sinusoidally with time. The one-dot chain line illustrated in FIG. 2A is a threshold Ath. The threshold Ath is a reference value of the variation range of the Hall signal (for example, the median value of the variation range). When the variation range of the Hall signal is set to have a lower limit amplitude Amin and an upper limit amplitude Amax, the threshold Ath is expressed by the following formulas 1 and 2, for example.

$$Ath \approx (Amin + Amax)/2 \quad \text{Formula 1}$$

$$Amax > Ath > Amin \geq 0 \quad \text{Formula 2}$$

The sampling unit 3 samples the Hall signal held in the sample hold unit 2 at the sampling timing and performs AD conversion to generate a digital value. The sampling unit 3 may have a timing generator (not illustrated), may perform sampling using the sampling clock generated by the timing generator, and may perform AD conversion of the Hall signal. That is, the sampling unit 3 may AD-convert the Hall signal in synchronization with the timing of the rising edge of the sampling clock to generate a digital value. This digital value may be approximately regarded as the sampling result of the analog signal waveform of the Hall signal in a case where the quantization error in AD conversion is small enough to be ignored. FIG. 2B is the result obtained by sampling the Hall signal at the sampling timing illustrated in FIG. 2C. In FIG. 2B, the sampling result is illustrated by a white circle plot. In FIG. 2C, the sampling timing is illustrated by a bar line. The sampling timing is, for example, the rising edge timing of the sampling clock.

The calculation unit 10 estimates the slope of the Hall signal by using the digital value of the sampling timing. The calculation unit 10 obtains the intersection timing at which the threshold intersects with the straight line corresponding to the estimated slope. The calculation unit 10 includes a threshold near point extraction unit 11, a threshold up/down determination unit 12, and an intersection point position generation unit 13.

The threshold up/down determination unit 12 receives the digital value from the sampling unit 3. The threshold Ath is set in advance in the threshold up/down determination unit 12. The threshold up/down determination unit 12 compares the received digital value with the threshold Ath to determine an up/down relation and supplies the determination result to the threshold near point extraction unit 11. For example, when the received digital value is larger than the threshold Ath, the threshold up/down determination unit 12 supplies an H level signal indicating "up" to the threshold near point extraction unit 11. When the received digital value is smaller than the threshold Ath, the threshold up/down determination unit 12 supplies an L level signal indicating "down" to the threshold near point extraction unit 11.

FIG. 2D illustrates the determination result output from the threshold up/down determination unit 12. The determination result illustrated in FIG. 2D is that the L level transitions to the H level at the sampling timing t2, the H level transitions to the L level at the sampling timing t4, the L level transitions to the H level at the sampling timing t6, and the H level transitions to the L level at the sampling timing t8.

The threshold near point extraction unit 11 receives the digital value from the sampling unit 3 and the determination result from the threshold up/down determination unit 12. The threshold near point extraction unit 11 holds the previous digital value and the current digital value received from the sampling unit 3. The threshold near point extraction unit 11 holds the previous determination result and the current determination result received from the threshold up/down determination unit 12. The threshold near point extraction unit 11 compares the previous and current determination results. In a case where the determination result changes, the threshold near point extraction unit 11 supplies the previous and current digital values to the intersection point position generation unit 13 assuming that the Hall signal crosses the threshold. When the previous digital value and determination result correspond to the first sampling timing, and the current digital value and determination result correspond to the second sampling timing, the first sampling timing and the second sampling timing are timings at which the levels of the Hall signal are arranged across the threshold Ath.

For example, when receiving the determination result of the H level at the sampling timing t2, the threshold near point extraction unit 11 compares the determination result with the L level which is the determination result of the previous sampling timing t1. As a result of the comparison, it is determined that the determination result changes, and the Hall signal crosses the threshold. In response thereto, the threshold near point extraction unit 11 supplies the previous and current digital values to the intersection point position generation unit 13. Similarly, the determination result changes at the sampling timings t4, t6, and t8, and the threshold near point extraction unit 11 supplies the previous and current digital values to the intersection point position generation unit 13.

The intersection point position generation unit 13 estimates the slope of the Hall signal by using the amplitudes indicated by the two digital values received from the threshold near point extraction unit 11. The two digital values indicate the amplitudes of sampling timings arranged across the threshold. The intersection point position generation unit 13 obtains the intersection timing at which the threshold intersects with the straight line corresponding to the estimated slope. The intersection point position generation unit 13 supplies the obtained intersection timing to the drive control unit 4.

For example, in a case where the digital value at the sampling timing t1 indicates an amplitude A1, and the digital value at the sampling timing t2 indicates an amplitude A2, it is estimated that the slope=(A2−A1)/(t2−t1). Assuming that the horizontal axis is a coordinate plane of a variable t, and the vertical axis is a coordinate plane of a variable A in FIG. 2B, a straight line L0 indicating the threshold is expressed as $$A = Ath \quad \text{Formula 3.}$$

Further, a straight line L1 according to the estimated slope is a straight line connecting two points (t1,A1) and (t2,A2) and is expressed as $$A - A2 = \{(A2 - A1)/(t2 - t1)\}(t - t2) \quad \text{Formula 4.}$$

The variable t is a variable which represents time, and the variable A is a variable which represents the amplitude of the analog signal (Hall signal). When the variable A is removed from Formula 3 and 4, and the solution is performed for the variable t, the intersection timing t12 as the solution is obtained such that $$t12 = \{(Ath - A2)(t2 - t1)/(A2 - A1)\} + t2 \quad \text{Formula 5.}$$

Similarly, in a case where the digital value at the sampling timing t3 indicates an amplitude A3 and the digital value at the sampling timing t4 indicates an amplitude A4, it is estimated that the slope=(A4−A3)/(t4−t3). The intersection timing t34 is obtained such that $$t34=\{(Ath-A4)(t4-t3)/(A4-A3)\}+t4 \quad \text{Formula 6.}$$

In a case where the digital value at the sampling timing t5 indicates an amplitude A5 and the digital value at the sampling timing t6 indicates an amplitude A6, it is estimated that the slope=(A6−A5)/(t6−t5). The intersection timing t56 is obtained such that $$t56=\{(Ath-A6)(t6-t5)/(A6-A5)\}+t6 \quad \text{Formula 7.}$$

In a case where the digital value at the sampling timing t7 indicates an amplitude A7 and the digital value at the sampling timing t8 indicates an amplitude A8, it is estimated that the slope=(A8−A7)/(t8−t7). The intersection timing t78 is obtained such that $$t78=\{(Ath-A8)(t8-t7)/(A8-A7)\}+t8 \quad \text{Formula 8.}$$

The drive control unit 4 obtains the rotation cycle ΔT from a plurality of intersection timings arranged temporally adjacent to each other and generates a cycle signal indicating the rotation cycle ΔT. For example, as for the rotation cycle ΔT, as illustrated in the following Formula 9, the time interval between a plurality of intersection timings arranged temporally adjacent to each other can be obtained as ΔT/2.

$$\Delta T/2 \approx t34-t12 \approx t56-t34 \approx t78-t56 \quad \text{Formula 9}$$

At this time, the drive control unit 4 may generate the cycle signal illustrated in FIG. 2E by correcting the edge portion of the signal of the determination result illustrated in FIG. 2D or may generate the cycle signal newly from the information of the intersection timing. In the cycle signal illustrated in FIG. 2E, the L level transitions to the H level at the intersection timing t12, the H level transitions to the L level at the intersection timing t34, the L level transitions to the H level at the intersection timing t56, and the H level transitions to the L level at the intersection timing t78.

The drive control unit 4 controls the driving of the motor MT according to the rotation cycle ΔT of the cycle signal. The drive control unit 4 performs PWM control according to the rotation cycle ΔT and supplies the driving power generated thereby to the motor MT. As a result, the drive control unit 4 can control the driving of the motor MT at an appropriate timing and can reduce the vibration and noise of the motor MT.

As described above, in this embodiment, the motor control device 1 estimates the slopes of the Hall signal which crosses the threshold, and obtains the rotation cycle of the motor MT from the intersection timings at which the threshold intersect with the straight lines corresponding to the estimated slopes. Accordingly, the motor MT may be controlled by accurately obtaining the rotation cycle of the motor MT without using a high-speed AD converter. As a result, without increasing the power consumption and heat generation of the motor control device 1, the sampling error may be reduced, and the vibration and noise of a motor MT may be reduced.

Incidentally, the hall element HE may be arranged in the motor control device 1. For example, the motor control device 1 may be configured as one module including the Hall element HE, and the module may be installed in the housing of the motor MT. Further, as the element for acquiring the rotation cycle, another device, such as a magnetic sensor, capable of sensing a position may be used as long as the element can acquire the rotation cycle.

The digital values at the time of generating the intersection with the threshold (calculating the slope) may be digital values of three or more sampling timings which cross the threshold as long as the digital values correspond to the portion which may be regarded as a substantially straight line in the waveform of the Hall signal.

Second Embodiment

In the first embodiment, the estimated slope of the Hall signal is used to generate the cycle signal indicating the rotation cycle of the motor MT. However, in a second embodiment, the estimated slope of the Hall signal is further used for switching to the sampling frequency (of a lower frequency, for example). In the following, the description will focus on the parts which are different from the first embodiment.

Figure 3:
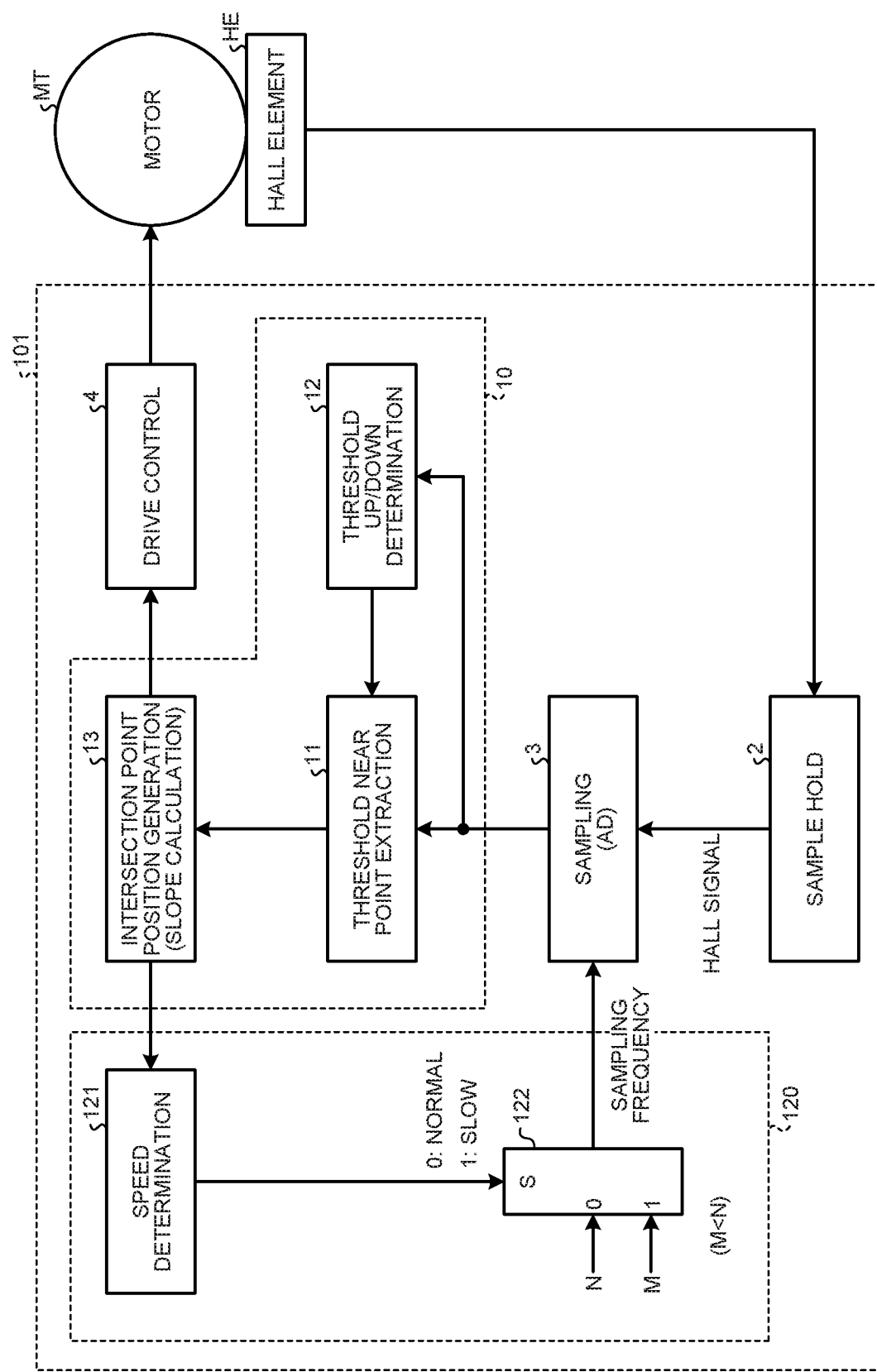
FIG. 3 is a block diagram illustrating a configuration of a motor control device according to a second embodiment.

FIG. 3 is a block diagram illustrating a configuration of a motor control device 101 according to the second embodiment. The motor control device 101 further includes a control unit 120. The control unit 120 controls the sampling frequency of the sampling unit 3 according to the slope estimated by the calculation unit 10.

In the motor MT, in a case where the rotation cycle is slow, the absolute value of the slope when the Hall signal crosses the threshold tends to be small. If the rotation cycle is slow, it is expected that the motor control device 101 may be reduced in power consumption and noise by reducing the sampling frequency.

The control unit 120 supplies the sampling frequency to the sampling unit 3 according to a magnitude relation between the estimated slope and a slope threshold. Alternatively, the control unit 120 may supply the sampling frequency in consideration of whether or not the magnitude relation is constant at a plurality of consecutive intersection timings. The control unit 120 controls the sampling unit 3 at a sampling frequency N when the estimated slope is larger than the slope threshold. The control unit 120 controls the sampling unit 3 at a sampling frequency M when the estimated slope is smaller than the slope threshold. The sampling frequency M is lower than the sampling frequency N. The slope threshold is a value indicating the limit of whether the required sampling accuracy may be secured even if the slope near the threshold Ath in the Hall signal is reduced in a case where the sampling frequency is set to M, and may be determined experimentally in advance. Accordingly, the motor control device 101 may stably control the sampling frequency.

The control unit 120 has a speed determination unit 121 and a selector 122. The speed determination unit 121 is arranged between the intersection point position generation unit 13 and the selector 122. The speed determination unit 121 receives the estimated slope from the intersection point position generation unit 13. The speed determination unit 121 compares the absolute value of the estimated slope with the slope threshold. The speed determination unit 121 supplies the speed determination result to the selector 122 according to the comparison result.

The selector 122 is arranged between the speed determination unit 121 and the sampling unit 3. The speed determination result by the speed determination unit 121 is supplied to a select node S of the selector 122. In the selector 122, the sampling frequency N is supplied to the input node "0" and the sampling frequency M is supplied to the input node "1".

If the absolute value of the estimated slope is larger than the slope threshold, the speed determination unit 121 determines that the rotation frequency of the motor MT is "normal" and supplies "0" as the speed determination result to the selector 122. The selector 122 selects the sampling frequency N in accordance with the speed determination result="0" and supplies the sampling frequency to the sampling unit 3. The sampling unit 3 generates a sampling clock having the sampling frequency N with a clock generator and performs AD conversion of the Hall signal.

If the absolute value of the estimated slope is smaller than the slope threshold, the speed determination unit 121 determines that the motor MT decelerates, and the rotation speed is "slow", and supplies "1" as the speed determination result to the selector 122. The selector 122 selects the sampling frequency M in accordance with the speed determination result="1"

and supplies the sampling frequency to the sampling unit 3. The sampling unit 3 generates a sampling clock having the sampling frequency M with the clock generator, and performs AD conversion of the Hall signal.

Next, a switching operation of the sampling frequency will be described. A variable of an angle which represents the slope of the Hall signal near the threshold is set as θ, and a variable which represents the sampling frequency is set as f. The motor control device 101 samples the Hall signal at the sampling timing, performs AD conversion, and obtains a sampling result. The motor control device 101 estimates the absolute value |θ| of the slope (angle) near the threshold Ath, and compares the estimated slope |θ| and the slope threshold α. The motor control device 101 sets the sampling frequency f=N when |θ|≥α, that is, when the rotation speed of the motor MT is "normal". On the other hand, when |θ|<α, that is, when the rotation speed of the motor MT is "slow", it is satisfied that the sampling frequency f=M. The sampling frequency f is 0<M<N[Hz].

FIGS. 4A and 4B are waveform charts illustrating an operation of the motor control device 101. At the timing t101, the slope |θ|=a, and the sampling frequency f=N. That is, when it is satisfied that |θ|=a≥α, the motor control device 101 determines that the rotation speed of the motor MT is "normal", and maintains the sampling frequency at N.

At timing t102, the motor control device 101 starts decelerating the motor MT to a predetermined rotation speed. Accordingly, the slope |θ| begins to decrease from a. That is, the deceleration period TP of the motor MT starts. Then, at timing t103, the motor control device 101 ends the deceleration when the motor MT reaches the predetermined rotation speed. That is, the slope |θ| becomes b, and the deceleration period TP of the motor MT ends. During the deceleration period TP, the motor control device 101 controls the motor MT to be maintained at a predetermined rotation speed.

At timings t102 to t103, the slope |θ| decreases from a to b (0<b<α≤a<90 [degrees]), and the motor control device 101 determines that the motor MT is in the deceleration period TP and maintains the sampling frequency f=N.

When the state in which the slope |θ| is substantially constant at b continues for a predetermined number of times, the motor control device 101 determines that the rotation speed of the motor MT is in a stable state and switches the sampling frequency f. Incidentally, the motor control device 101 switches the sampling frequency while avoiding the vicinity of the intersection timing at which the Hall signal crosses the threshold Ath. In the example of FIGS. 4A and 4B, the slope becomes b at the timing t103, becomes b consecutively six times at the timings t103 to t108, and switches to the sampling frequency M at the timing t109. The motor control device 101 switches the sampling frequency at the timing t109 between the timings t108 and t110 while avoiding the intersection timings t108 and t110. In the second embodiment, when it is satisfied that the estimated slope is smaller than the predetermined slope at a plurality of consecutive intersection timings, the motor control device 101 controls the sampling frequency to the value M smaller than the normal value N. Accordingly, power consumption and noise of the motor control device 101 may be reduced, and the sampling frequency can be controlled stably.

Incidentally, although not illustrated, the motor control device 101 may perform control to accelerate the rotation speed of the motor MT in order to return the rotation speed to "normal". When the rotation speed reaches the normal rotation speed at a plurality of consecutive intersection timings, the motor control device 101 may perform control to return the sampling frequency from M to N. Accordingly, the sampling frequency can be controlled more stably. Alternatively, the motor control device 101 may perform control to accelerate the rotation speed of the motor MT in order to make the rotation speed faster than "normal".

In the second embodiment, the value of the sampling frequency f is switched between the two values N and M. However, the value may be switched among three or more values N, M, and K. In this case, α and β (0<β<α<90 [degrees]) are used as the slope thresholds to determine the slope |θ|. In the case of |θ|≥α, the sampling frequency f may be set to N, in the case of β≤|θ|<α, the sampling frequency f may be set to M, and in the case of |θ|<β, the sampling frequency f may be set to K.

Incidentally, the number of consecutive times when the end of acceleration or the end of deceleration is determined may be one or more, or may differ between acceleration and deceleration. Further, although the slope |θ| is set to arbitrary value a or b, the slope may be set to a value a1≤θ<a2 or b1≤θ<b2 having a width. Further, the slope threshold α may be set in the motor control device 101 in advance or may be set externally from a microcomputer or the like.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A motor control device comprising:
   an acquisition unit that acquires an analog signal indicating a rotational position of a motor;
   an AD conversion unit that AD-converts the analog signal to generate a digital value;
   a calculation unit that estimates a slope of a waveform of the analog signal by using a plurality of the digital values and obtains an intersection timing at which a straight line corresponding to the estimated slope intersects with a threshold; and
   a drive control unit that controls driving of the motor according to a rotation cycle obtained from a plurality of the intersection timings,
   wherein the AD conversion unit AD-converts the analog signal at a plurality of sampling timings at which levels of the analog signal are arranged across the threshold to generate the plurality of digital values, and the calculation unit estimates the slope of the analog signal waveform by using the plurality of generated digital values, the calculation unit includes a holding unit that holds a first digital value received at a first sampling timing and a second digital value received at a second sampling timing, a determination unit that determines a magnitude relation between the first digital value and the threshold to generate a first determination result and determines a magnitude relation between the second digital value received at the second sampling timing and the threshold to generate a second determination result, and an estimation unit that estimates the slope of the analog signal waveform by using the first digital value and the second digital value according to the first determination result and the second determination result, the holding unit supplies the first digital value and the second digital value to the estimation unit in a case where the first determination result is different from the second determination result.

2. The motor control device according to claim 1, wherein the threshold is a value which serves as a reference for a variation range of the analog signal.

3. The motor control device according to claim 2, wherein the threshold is a median value of the variation range of the analog signal.

4. The motor control device according to claim 1, wherein the drive control unit obtains the rotation cycle from the plurality of intersection timings arranged temporally adjacent to each other.

5. The motor control device according to claim 1, wherein the estimation unit obtains a first straight line according to a first coordinate point corresponding to the first digital value and a second coordinate point corresponding to the second digital value on a coordinate plane having an axis of a first variable representing time and an axis of a second variable representing an amplitude of the analog signal, and obtains a value of the first variable where the first straight line intersects with the threshold as a first intersection timing.

6. The motor control device according to claim 1, wherein the holding unit holds a third digital value received at a third sampling timing, the determination unit determines a magnitude relation between the third digital value and the threshold to generate a third determination result, and the holding unit does not supply the third digital value to the estimation unit in a case where the second determination result is the same as the third determination result.

7. The motor control device according to claim 6, wherein the holding unit holds a fourth digital value received at a fourth sampling timing, the determination unit determines a magnitude relation between the fourth digital value received at the fourth sampling timing and the threshold to generate a fourth determination result, the holding unit supplies the third digital value and the fourth digital value to the estimation unit in a case where the third determination result is different from the fourth determination result, and the estimation unit estimates the slope of the analog signal waveform by using the third digital value and the fourth digital value.

8. The motor control device according to claim 7, wherein the estimation unit obtains a first straight line according to a first coordinate point corresponding to the first digital value and a second coordinate point corresponding to the second digital value on a coordinate plane of a first variable representing time and a second variable representing an amplitude of the analog signal, obtains a value of the first variable where the first straight line intersects with the threshold as a first intersection timing, obtains a second straight line according to a third coordinate point corresponding to the third digital value and a fourth coordinate point corresponding to the fourth digital value on the coordinate plane, and obtains a value of the first variable where the second straight line intersects with the threshold as a second intersection timing.

9. The motor control device according to claim 8, wherein the drive control unit obtains the rotation cycle by setting a time interval between the first intersection timing and the second intersection timing to be half of the rotation cycle.

10. The motor control device according to claim 1, the device further comprising:

a control unit that supplies a first sampling frequency or a second sampling frequency smaller than the first sampling frequency to the AD conversion unit according to the estimated slope, wherein the AD conversion unit performs AD conversion of the analog signal at a sampling timing based on the supplied first or second sampling frequency.

11. The motor control device according to claim 10, wherein the control unit supplies the first sampling frequency to the AD conversion unit when the estimated slope is larger than a predetermined slope, and supplies the second sampling frequency to the AD conversion unit when the estimated slope is smaller than the predetermined slope.

12. The motor control device according to claim 11, wherein the control unit supplies the second sampling frequency to the AD conversion unit when it is satisfied that the estimated slope is consecutively smaller than the predetermined slope.

13. The motor control device according to claim 12, wherein the control unit supplies the second sampling frequency to the AD conversion unit when it is satisfied that the estimated slope is smaller than the predetermined slope at a plurality of sampling timings arranged temporally continuously.

14. The motor control device according to claim 1, wherein the acquisition unit acquires an analog signal from a magnetic sensor which detects a rotational position of the motor.

15. The motor control device according to claim 13, wherein the magnetic sensor is a Hall element attached in a housing of the motor.

16. The motor control device according to claim 1, wherein the motor is a single-phase motor or a three-phase motor.

* * * * *